(12) United States Patent
Hirano

(10) Patent No.: US 6,441,757 B1
(45) Date of Patent: Aug. 27, 2002

(54) DECODING APPARATUS AND DECODING METHOD FOR VARIABLE LENGTH CODES

(75) Inventor: Kenji Hirano, Sakai (JP)

(73) Assignee: Kanebo, Limited, Tokyo (JP)

(*) Notice: Subject to any disclaimer, the term of this patent is extended or adjusted under 35 U.S.C. 154(b) by 0 days.

(21) Appl. No.: 09/622,399

(22) PCT Filed: Sep. 2, 1999

(86) PCT No.: PCT/JP99/00861
§ 371 (c)(1),
(2), (4) Date: Nov. 6, 2000

(87) PCT Pub. No.: WO99/44293
PCT Pub. Date: Sep. 2, 1999

(30) Foreign Application Priority Data

Feb. 26, 1998 (JP) .......................................... 10-044790

(51) Int. Cl.⁷ ................................................ H03M 7/40
(52) U.S. Cl. ............................................ 341/67; 341/65
(58) Field of Search ............................ 341/67, 65, 59; 382/246, 245

(56) References Cited

U.S. PATENT DOCUMENTS 6,219,457 B1 * 4/2001 Potu ........................... 341/101

FOREIGN PATENT DOCUMENTS

| JP | 2-254824 | 10/1990 |
| JP | 5-327516 | 12/1993 |
| JP | 8-11645 | 4/1996 |

* cited by examiner

Primary Examiner—Brian Young
(74) Attorney, Agent, or Firm—Morgan & Finnegan, L.L.P.

(57) ABSTRACT

A decoding apparatus and method for variable-length codes wherein data which consist of a plurality of variable-length codes are subjected to decode processing at a higher speed, comprising: a first logic circuit which delivers necessary-length data; decode means for decoding the necessary-length data in accordance with remaining data in a preceding cycle and then outputting the decoded data; and first control means connected to the decode means, for controlling the first logic circuit.

6 Claims, 4 Drawing Sheets

DECODING APPARATUS AND DECODING METHOD FOR VARIABLE LENGTH CODES

TECHNICAL FIELD

The present invention relates to decoding apparatuses for decoding digital data, and more particularly to a decoding apparatus and a decoding method for decoding data which is composed of encoded variable-length codes.

BACKGROUND ART

Heretofore, regarding digital data expressive of an image by way of example, encoding techniques which comply with redundancy, and efficient encoding apparatuses/encoding methods as well as decoding apparatuses/decoding methods which correspond to the encoding techniques have been devised in large numbers, and Huffman encoding is also deemed one of the encoding techniques for mitigating the redundancy of the digital data.

Besides, decoding apparatuses and decoding methods which correspond to the Huffman encoding technique have hitherto been devised in large numbers.

Here, heightening the speed of decode processing is always posed as a problem in the decoding apparatus and decoding method corresponding to the Huffman encoding technique, as in the decoding apparatus for any other encoding technique.

Accordingly, the present invention has for its object to provide a decoding apparatus and a decoding method for variable-length codes in which data composed of variable-length codes generated by the Huffman encoding or the like is subjected to decode processing at a higher speed.

DISCLOSURE OF THE INVENTION

The present invention consists in a decoding apparatus for variable-length codes wherein input data which consist of a plurality of variable-length codes of at most N bits are decoded successively in a plurality of cycles, comprising:

a first logic circuit which receives the input data, and which delivers necessary-length data having the minimum number of bits that is a multiple of k and that exceeds N;

decode means connected to said first logic circuit, for delivering a data length of remaining data obtained by removing the first variable-length code contained in the necessary-length data, from said necessary-length data, and for decoding said necessary-length data in accordance with the remaining data in the preceding cycle and then outputting the decoded data; and first control means connected to said decode means, for controlling said first logic circuit so as to receive the input data having the number of bits that is the multiple of k depending upon the data length of said remaining data;

wherein symbol N denotes a natural number of at least 2, and symbol k denotes a natural number smaller than the number N.

Besides, the present invention consists in a decoding apparatus for variable-length codes, wherein said decode means is constructed including:

storage means for prestoring therein reference data corresponding to the plurality of variable-length codes contained in said input data;

movement means for moving the reference data in accordance with said data length of said remaining data;

comparison means for comparing the received necessary-length data and said reference data moved by said movement means;

code discrimination means for discriminating and outputting the variable-length code contained in said input data, in accordance with a result of the comparison made by said comparison means, and for feeding said first control means with said data length of said remaining data; and second control means for feeding said movement means with said data length of said remaining data as determined in accordance with a result of the discrimination made by said code discrimination means.

Besides, the present invention consists in a decoding apparatus for variable-length codes, wherein said decode means is constructed including:

a second logic circuit which concatenates the received necessary-length data with said remaining data in said preceding cycle;

storage means for prestoring therein reference data corresponding to the plurality of variable-length codes contained in said input data;

comparison means for (comparing data delivered from said second logic circuit and the reference data;

code discrimination means for discriminating and outputting the variable-length code contained in said input data, in accordance with a result of the comparison made by said comparison means, and for feeding said first control means with said data length of said remaining data; and second control means for feeding said second logic circuit with said remaining data determined in accordance with a result of the discrimination made by said code discrimination means.

Further, the present invention consists in a decoding method for variable-length codes wherein input data which consist of a plurality of variable-length codes of at most N bits are decoded successively in a plurality of cycles, comprising:

computing from the input data, necessary-length data having the minimum number of bits that is a multiple of k and that exceeds N;

subjecting the necessary-length data to decode processing in accordance with remaining data in the preceding cycle;

computing a data length of the remaining data obtained by removing the first variable-length code contained in said necessary-length data, from said necessary-length data; and controlling said input data so as to have the number of bits that is the multiple of k, in accordance with the data length of said remaining data;

wherein symbol N denotes a natural number of at least 2, and symbol k denotes a natural number smaller than the number N.

Besides, the present invention consists in a decoding method for variable-length codes, wherein said decode processing includes:

prestoring reference data corresponding to the plurality of variable-length codes contained in said input data;

moving the reference data in accordance with said data length of said remaining data;

comparing the received necessary-length data and the moved reference data; and discriminating and outputting the variable-length code contained in said input data, in accordance with a result of the comparison, and computing said data length of said remaining data.

Besides, the present invention consists in a decoding method for variable-length codes, wherein said decode processing includes:

prestoring reference data corresponding to the plurality of variable-length codes contained in said input data;

concatenating the received necessary-length data with said remaining data in said preceding cycle;

comparing the concatenated data and said reference data; and discriminating and outputting the variable-length code contained in said input data, in accordance with a result of the comparison, and computing said remaining data.

BRIEF DESCRIPTION OF THE DRAWINGS

FIG. 4 is a block diagram showing the construction of a variable-length code decoding apparatus according to Embodiment 2 of the present invention. In the drawings, numeral 1 indicates a logic circuit, numeral 3 a Huffman decoder, numeral 5 a control circuit, numeral 31 a logic circuit, numeral 32 a table, numeral 33 a comparator, numeral 34 a code discriminator, numeral 35 a control circuit, numeral 36 a table shift portion, and numeral 37 a control circuit.

BEST MODES FOR CARRYING OUT THE INVENTION

Now, the embodiments of the present invention will be described in detail with reference to the drawings. Incidentally, throughout the drawings, the same symbols indicate the same or equivalent parts.

EMBODIMENT 1

Figure 1:
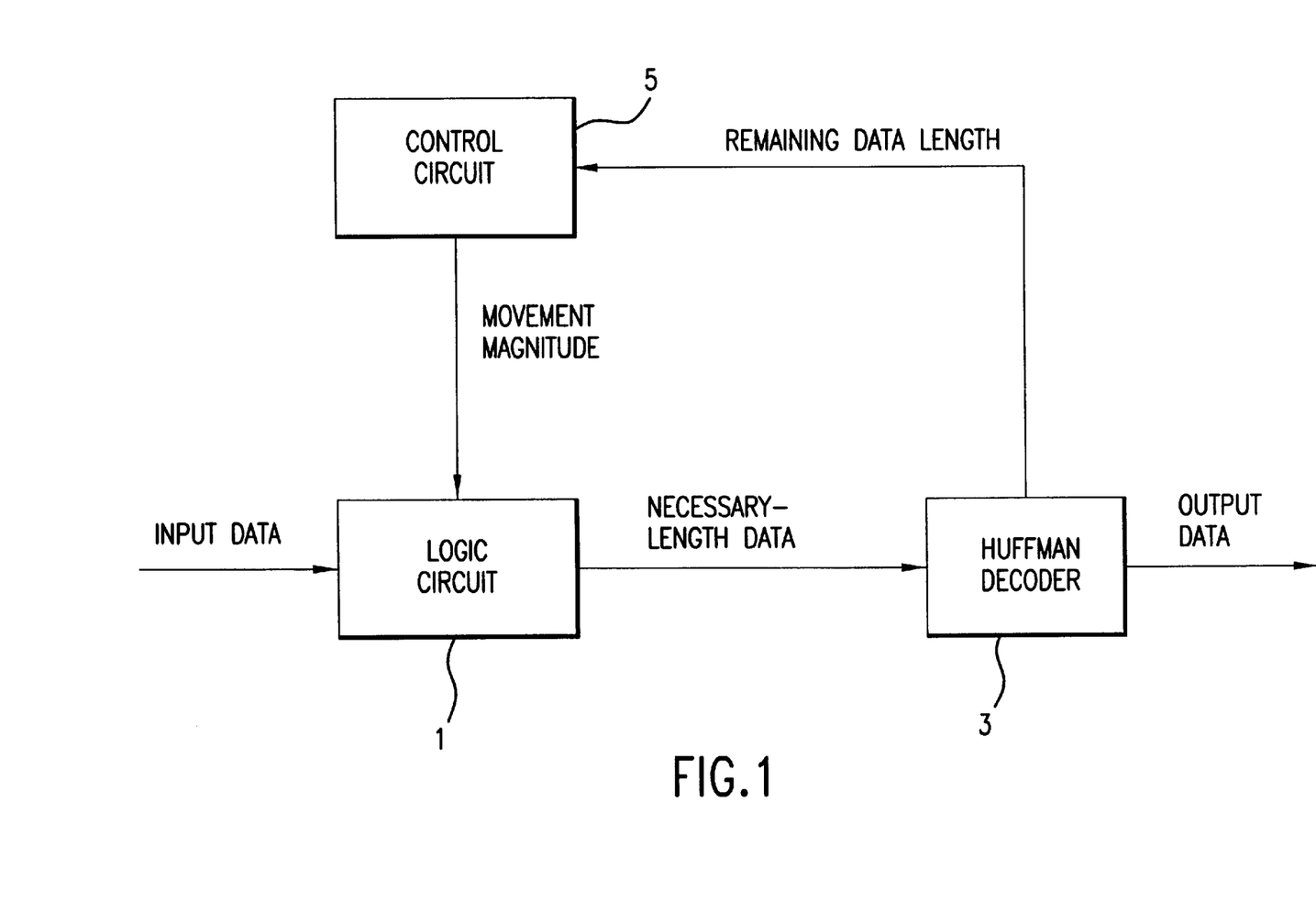
FIG. 1 is a block diagram showing the whole construction of a variable-length code decoding apparatus according to Embodiment 1 of the present invention.

FIG. 1 is a block diagram showing the whole construction of a decoding apparatus for variable-length codes according to Embodiment 1 of the present invention.

As shown in FIG. 1, the decoding apparatus for variable-length codes according to the present invention comprises a first logic circuit 1 which receives input data composed of a plurality of variable-length codes generated by a Huffman encoding technique, a Huffman decoder 3 which is decode means connected to the logic circuit 1, and a control circuit 5 which is first control means connected to the Huffman decoder 3 and for controlling the logic circuit 1.

Here, the logic circuit 1 inputs necessary-length data to the Huffman decoder 3. The "necessary-length data" is intended to signify data having the minimum number of bits (a data length) which exceeds N (N being a natural number of at least 2) denoting the maximum length that can be occupied by the individual variable-length codes, and which is a multiple of k (k being a natural number smaller than N).

In addition, the Huffman decoder 3 decodes the inputted necessary-length data and delivers the decoded data as output data, and it feeds a remaining data length to the control circuit 5. Here, the "remaining data length" is intended to signify a value obtained in such a way that the code length of the first variable-length code contained in the necessary-length data is subtracted from the data length of the inputted necessary-length data.

Besides, the control circuit 5 feeds the logic circuit 1 with a movement magnitude Which depends upon the inputted remaining data length. Here, the "movement magnitude" is intended to signify the length of data which is to be inputted anew in the next cycle by the logic circuit 1, and which is calculated from the remaining data length and is set at a multiple of the number k.

Next, the decoding method for variable-length codes according to Embodiment 1 of the present invention comprises:

the necessary-length-data computation step of computing necessary-length data which has the minimum number of bits being a multiple of the number k and exceeding the number N, from input data which consists of the plurality of variable-length codes generated by the Huffman encoding technique:

the decoded-data computation step of subsequently subjecting the necessary-length data to decode processing in accordance with remaining data in a preceding cycle;

the remaining-data-length computation step of subsequently computing the data length of the remaining data in which the first variable-length code contained in the necessary-length data has been removed from the necessary-length data; and the input-data control step of controlling the input data so as to have the number of bits being the multiple of the number K, in accordance with the data length of the remaining data.

As stated before, the "necessary-length data" is intended to signify data having the minimum number of bits (a data length) which exceeds N (N being a natural number of at least 2) denoting the maximum length that can be occupied by the individual variable-length codes, and which is a multiple of k (k being a natural number smaller than N).

The decoding method in the decoding apparatus for variable-length codes as shown in FIG. 1 will be described in detail below with reference to FIG. 2. Incidentally, in FIG. 2, a case where the maximum length of individual variable-length codes is 10 bits (N=10) and where k=6 holds is illustrated by way of example. Besides, as shown at (a) in FIG. 2, input data shall contain the variable-length codes having code lengths of 5 bits, 7 bits and 9 bits in order from the first code.

Figure 2:
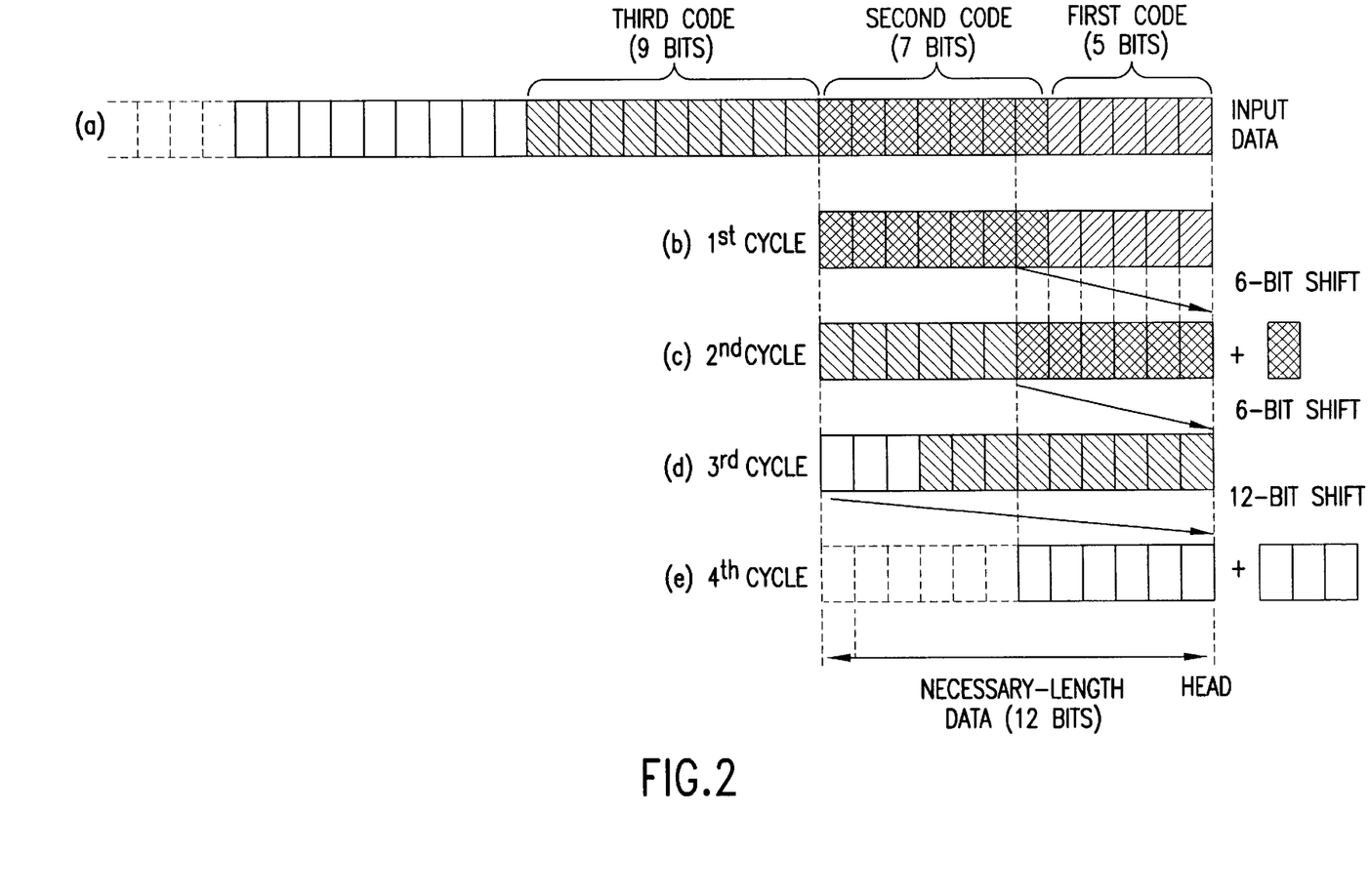
FIG. 2 is a diagram for explaining the operation of the variable-length code decoding apparatus shown in FIG. 1.

As shown at (b) in FIG. 2, in the 1st cycle, the minimum number which is a multiple of 6 (=k) and which is larger than 10 (=N), that is, 12 is computed as a necessary length at the necessary-length-data computation step, so that data items amounting to 12 bits are inputted to the logic circuit 1 and the Huffman decoder 3 successively from the head. Subsequently, at the decoded-data computation step, the Huffman decoder 3 decodes the first code composed of 5 bits and delivers the decoded data as output data. Subsequently, at the remaining-data-length computation step, the Huffman decoder 3 computes the remaining data length of the 1st cycle, and it feeds the control circuit 5 with a signal which indicates that the remaining data length is 7 bits (=12−5).

At the input-data control step, the control circuit 5 computes the movement magnitude of input data required for outputting necessary-length data of at least 12 bits from the logic circuit 1 in the 2nd cycle, in accordance with the remaining data length of 7 bits. The control circuit 5 feeds the logic circuit 1 with a signal which indicates that the movement magnitude is 6 bits ($6 \geq 12-7$). By the way, the movement magnitude of the input data is a multiple of 6 bits.

Besides, in the 2nd cycle, necessary-length data shown at (c) in FIG. 2 is computed at the necessary-length-data computation step, and it is inputted to the Huffman decoder 3 through the logic circuit 1. At the decoded-data computation step, decode processing is done in accordance with the remaining data of the 1st cycle. More specifically, the Huffman decoder 3 executes the decode processing by the concatenation (into 13 bits) between the remaining data (of 1 bit) with 6 (=k) subtracted from 7 bits being the remaining data length of the 1st cycle and the necessary-length data (of 12 bits) inputted in the 2nd cycle anew, thereby to decode the second code which is composed of 7 bits. Subsequently, at the remaining-data-length computation step, the Huffman decoder 3 computes the remaining data length of the 2nd cycle, and it feeds the control circuit 5 with a signal which indicates that the remaining data length is 6 bits (=13−7).

At the input-data control step, the control circuit 5 computes the movement magnitude of input data required for outputting necessary-length data of at least 12 bits from the logic circuit 1 in the 3rd cycle, in accordance with the remaining data length of 6 bits. The control circuit 5 feeds the logic circuit 1 with a signal which indicates that the movement magnitude is 6 bits ($6 \geq 12-6$).

Besides, in the 3rd cycle, necessary-length data shown at (d) in FIG. 2 is computed at the necessary-length-data computation step, and it is inputted to the Huffman decoder 3 through the logic circuit 1. At the decoded-data computation step, decode processing is done in accordance with the remaining data of the 2nd cycle. More specifically, the Huffman decoder 3 executes the decode processing by the concatenation (into 12 bits) between the remaining data (of 0 bit) with 6 (=k) subtracted from 6 bits being the remaining data length of the 2nd cycle and the necessary-length data (of 12 bits) inputted in the 3rd cycle anew, thereby to decode the third code which is composed of 9 bits. Subsequently, at the remaining-data-length computation step, the Huffman decoder 3 computes the remaining data length of the 3rd cycle, and it feeds the control circuit 5 with a signal which indicates that the remaining data length is 3 bits (=12−9).

At the input-data control step, the control circuit 5 computes the movement magnitude of input data required for outputting necessary-length data of at least 12 bits from the logic circuit 1 in the 4th cycle, in accordance with the remaining data length of 3 bits. The control circuit 5 feeds the logic circuit 1 with a signal which indicates that the movement magnitude is not sufficient with 6 bits, but it is 12 bits ($12 \geq 12-0$) being a multiple of 6.

Besides, in the 4th cycle, necessary-length data shown at (e) in FIG. 2 is computed at the necessary-length-data computation step, and it is inputted to the Huffman decoder 3 through the logic circuit 1. At the decoded-data computation step, decode processing is done in accordance with the remaining data of the 3rd cycle. More specifically, the Huffman decoder 3 executes the decode processing by the concatenation (into 15 bits) between the remaining data (of 3 bits), which has been calculated without subtracting 6 (=k) from the remaining data length because the remaining data length of the 3rd cycle is 3 bits and is less than 6 bits (=k), and the necessary-length data (of 12 bits) inputted in the 4th cycle anew, thereby to decode the fourth code.

Owing to such a decoding method, the decoding apparatus for variable-length codes according to this embodiment decodes the plurality of variable-length codes inputted successively in the respective cycles.

Figure 3:
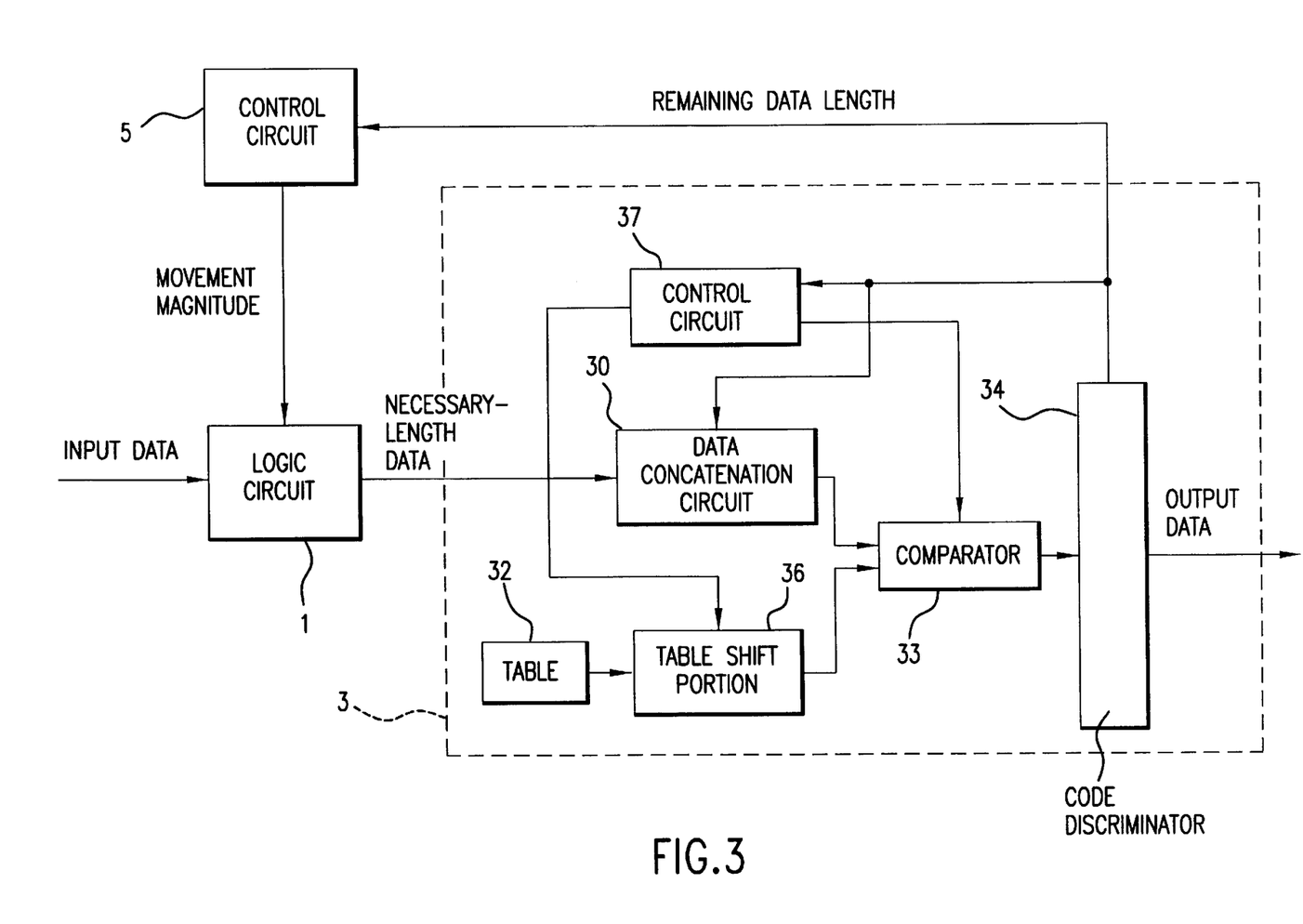
FIG. 3 is a block diagram showing more concretely the construction of the variable-length code decoding apparatus according to Embodiment 1 of the present invention.

FIG. 3 is a block diagram showing more concretely the construction of the Huffman decoder 3 which is decode means, in the decoding apparatus for variable-length codes according to this embodiment.

As shown in FIG. 3, the Huffman decoder 3 includes a table 32 which is storage means for prestoring therein reference data (table data) corresponding to a plurality of variable-length codes contained in input data, a table shift portion 36 which is movement means connected to the table 32, a data concatenation circuit 30 which is connected to the logic circuit 1, a comparator 33 which is comparison means connected to the data concatenation circuit 30 as well as the table shift portion 36, a code discriminator 34 which is code discrimination means connected to the comparator 33, and a control circuit 37 which is second control means connected to the code discriminator 34 and for controlling the table shift portion 36 as well as the comparator 33.

Here, the control circuit 37 calculates a table movement magnitude on the basis of a remaining data length delivered from the code discriminator 34 and feeds the calculated value to the table shift portion 36. Besides, the table shift portion 36 moves (shifts) the table data on the basis of the table movement magnitude fed from the control circuit 37.

Next, there will be described a decoding method for variable-length codes showing more concretely decode processing, in the decoding method for variable-length codes according to this embodiment.

In the decoding method, the steps of the decode processing include:

the table-data storage step of prestoring in a table, reference data corresponding to the plurality of variable-length codes contained in the input data;

the table shift step of moving the reference data in accordance with the data length of remaining data;

the data comparison step of subsequently comparing the inputted necessary-length data and the moved reference data; and the code-data discrimination step of subsequently discriminating and outputting the variable-length code contained in the input data, in accordance with the result of the comparison, and computing the data length of remaining data.

By the way, the "table-data storage step" is intended to signify the step of writing (loading) reference data (table data) which correspond to a plurality of variable-length codes contained in input data, into the table before executing the decode processing.

The decoding method for variable-length codes in the case where the input data shown at (a) in FIG. 2 has been inputted to the logic circuit 1, will be described in detail below.

The decode processing is such that reference data shifted by the table shift portion 36, and remaining data in a preceding cycle and necessary-length data inputted in a current cycle as concatenated by the data concatenation circuit 30, are delivered at the table shift step; that both the data are subsequently compared by the comparator 33 at the data comparison step; and that, when the data have matched, the variable-length code contained in input data is subsequently discriminated by the code discriminator 34 at the code-data discrimination step, the variable-length codes being discriminated one by one successively in respective cycles. Then, the result of the discrimination is delivered as output data from the code discriminator 34.

In the case of the data as shown in FIG. 2, the decode processing is done as follows: When the code discriminator 34 has discriminated the first code composed of 5 bits in the 1st cycle, the control circuit 37 and the data concatenation circuit 30 receive from the code discriminator 34 a signal which indicates that the remaining data length of the 1st cycle is 7 bits. Thus, at the table shift step, the control circuit 37 controls the table shift portion 36 so as to shift table data (in this case, reference data which correspond to the second code composed of 7 bits, et seq.) by 1 bit in the 2nd cycle, and the data concatenation circuit 30 concatenates necessary-length data inputted in the 2nd cycle and the remaining data (1 bit) of the 1st cycle.

Besides, when the code discriminator 34 has subsequently discriminated the second code composed of 7 bits in the 2nd cycle, the control circuit 37 and the data concatenation circuit 30 receive from the code discriminator 34 a signal which indicates that the remaining data length of the 2nd cycle is 6 bits. Thus, at the table shift step, the control circuit 37 controls the table shift portion 36 so as to shift table data (in this case, reference data which correspond to the third code composed of 9 bits, et seq.) by 0 bit in the 3rd cycle, and the data concatenation circuit 30 concatenates necessary-length data inputted in the 3rd cycle and the remaining data (0 bit) of the 2nd cycle.

Besides, when the code discriminator 34 has subsequently discriminated the third code composed of 9 bits in the 3rd cycle, the control circuit 37 and the data concatenation circuit 30 receive from the code discriminator 34 a signal which indicates that the remaining data length of the 3rd cycle is 3 bits. Thus, at the table shift step, the control circuit 37 controls the table shift portion 36 so as to shift table data (in this case, reference data which correspond to the fourth code, et seq.) by 3 bits in the 4th cycle, and the data concatenation circuit 30 concatenates necessary-length data inputted in the 4th cycle and the remaining data (3 bits) of the 3rd cycle.

Besides, at the data comparison step, the control circuit 37 feeds the comparator 33 every cycle with a signal which designates a comparison region for the shifted reference data and the necessary-length data. Here, the comparison region at the data comparison step is set at the sum of the necessary length and the shift magnitude, and it is set to be a region of 12 bits (12+0) from the head of the input data in the 1st cycle, a region of 13 bits (12+1) from the head of the second code in the 2nd cycle, a region of 12 bits (12+0) from the head of the third code in the 3rd cycle, and a region of 15 bits (12+3) from the head of the fourth code in the 4th cycle.

Incidentally, the case where the maximum length of the individual variable-length codes is 10 bits (N=10) and where k=6 holds has been described by way of example in the above. However, the values N and k are not restricted to them, but in an actual product, N=26 and k=8 are held, while a necessary length is set at 32 bits. In this case, accordingly, a remaining data length is expressed by 5 bits, a movement magnitude is set at the number of bits being a multiple of 8 up to 32, and a signal for designating a comparison region is set at 3 bits.

Meanwhile, the inputting (shift) of data in the logic circuit 1 is usually performed by a circuit called "barrel shifter". On this occasion, the number of the cases of the shift magnitude (two cases of 6 bits and 12 bits in the example shown in FIG. 2) governs the processing speed of the circuit, and the processing time thereof becomes longer as the number of the cases is larger.

Consequently, in accordance with the decoding apparatus and decoding method for variable-length codes according to this embodiment, the processing speed of the logic circuit 1 can be made higher. Besides, since the processing of shifting, not only data, but also a table in parallel (concurrently) is executed, decode processing faster than in the prior art can be realized as a whole.

EMBODIMENT 2

Figure 4:
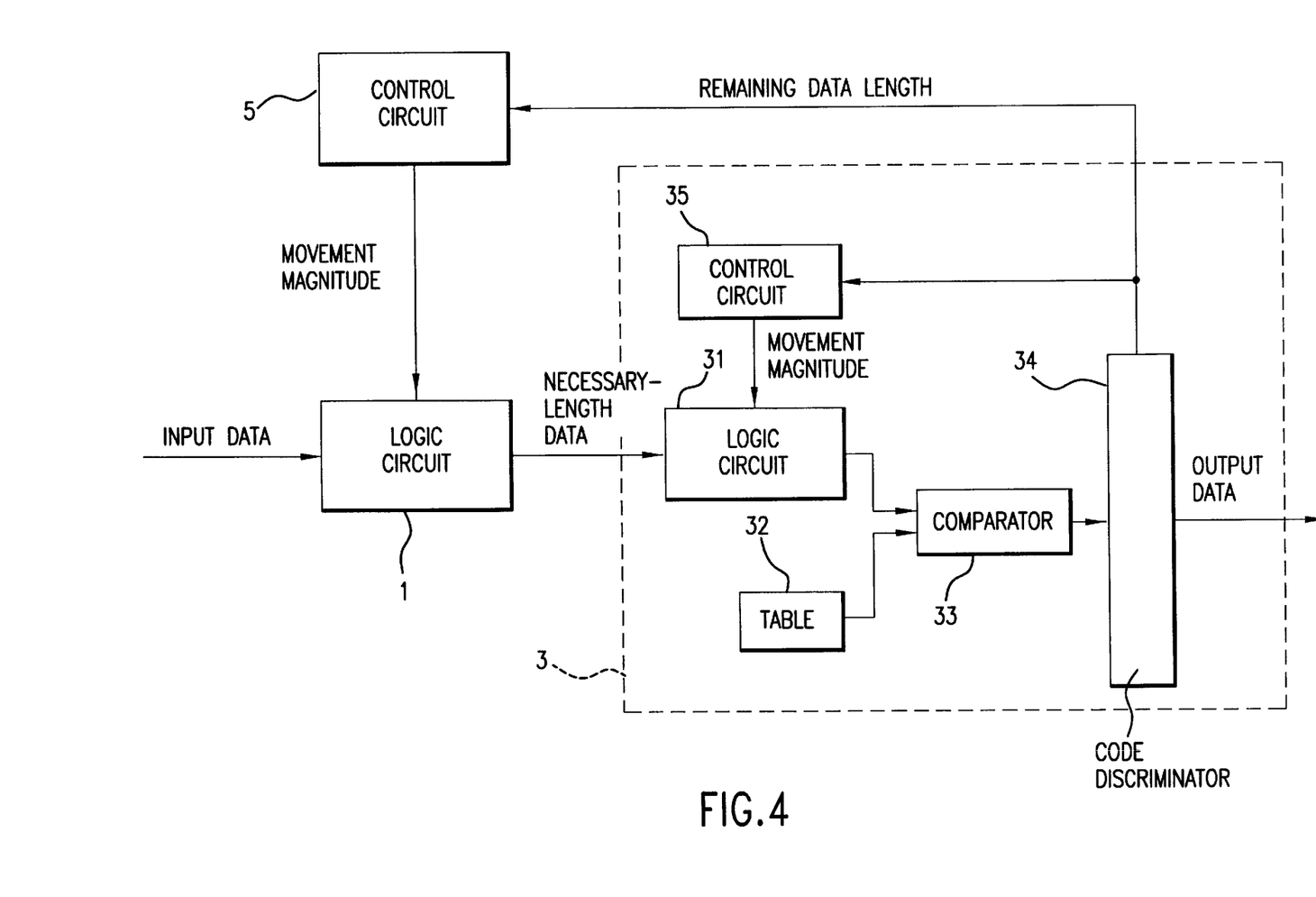

FIG. 4 is a diagram showing the construction of a decoding apparatus for variable-length codes according to this embodiment. As shown in FIG. 4, the decoding apparatus for variable-length codes has the construction similar to that of the decoding apparatus for variable-length codes according to Embodiment 1, but it differs in the construction of the Huffman decoder 3 being the decode means.

More specifically, the Huffman decoder 3 comprised in the decoding apparatus for variable-length codes according to this embodiment includes a logic circuit 31 which is a second logic circuit connected to the logic circuit 1, a table 32, a comparator 33 which is connected to the logic circuit 31 as well as the table 32, a code discriminator 34 which is connected to the comparator 33, and a control circuit 35 which is second control means connected to the code discriminator 34 and for controlling the logic circuit 31.

Next, there will be described a decoding method for variable-length codes according to Embodiment 2 of the present invention. The decoding method for variable-length codes has steps similar to those of the decoding method for variable-length codes according to Embodiment 1, but it differs in the steps of the decode processing.

More specifically, in the decoding method for variable-length codes according to this embodiment, the steps of the decode processing include:

the table-data storage step of prestoring in a table, reference data corresponding to the plurality of variable-length codes contained in the input data;

the data concatenation step of concatenating the received necessary-length data and remaining data in the preceding cycle;

the data comparison step of subsequently comparing the concatenated data and the reference data; and the code-data discrimination step of subsequently discriminating and outputting the variable-length code contained in the input data, in accordance with the result of the comparison, and computing the data length of the remaining data.

By the way, it is the same as in Embodiment 1 that the "table-data storage step" is the step of writing (loading) reference data (table data) which correspond to a plurality of variable-length codes contained in input data, into the table before executing the decode processing.

The decoding method for variable-length codes in the Huffman decoder 3 according to Embodiment 2 will be described below by exemplifying the case where the input data shown in FIG. 2 is inputted to the logic circuit 1.

In the 1st cycle, necessary-length data shown at (b) in FIG. 2 is inputted to the logic circuit 31, and the comparator 33 subsequently compares the necessary-length data and corresponding reference data at the data comparison step. Besides, on condition that both the data have matched as the result of the comparison, the code discriminator 34 discriminates the first code composed of 5 bits and delivers this code as output data at the code-data discrimination step, while it feeds the control circuit 5 and the control circuit 35 with a signal which indicates that the remaining data length of the 1st cycle is 7 bits.

Subsequently, in the 2nd cycle, necessary-length data shown at (c) in FIG. 2 is inputted to the logic circuit 31. The necessary-length data inputted in the 2nd cycle and remaining data in the 1st cycle are concatenated at the data concatenation step. The resulting data is shifted by 1 bit because the remaining data length of the 1st cycle is 1 owing to the control circuit 35. Thus, the heads of reference data corresponding to the second code, et seq. as contained in the table 32 and data delivered from the logic circuit 31 are brought into agreement, thereby to permit a comparison in the comparator 33 at the data comparison step being the next step. Besides, on condition that both the data have matched as the result of the comparison, the code discriminator 34 discriminates the second code composed of 7 bits and delivers this code as output data at the code-data discrimination step, while it feeds the control circuit 5 and the control circuit 35 with a signal which indicates that the remaining data length of the 2nd cycle is 6 bits.

Subsequently, in the 3rd cycle, necessary-length data shown at (d) in FIG. 2 is inputted to the logic circuit 31. The necessary-length data inputted in the 3rd cycle and remaining data in the 2nd cycle are concatenated at the data concatenation step. The resulting data is not shifted because the remaining data length of the 2nd cycle is 6 owing to the control circuit 35. Thus, the heads of reference data corresponding to the third code, et seq. as contained in the table 32 and data delivered from the logic circuit 31 are brought into agreement, thereby to permit a comparison in the comparator 33 at the data comparison step being the next step. Besides, on condition that both the data have matched as the result of the comparison, the code discriminator 34 discriminates the third code composed of 9 bits and delivers this code as output data at the code-data discrimination step, while it feeds the control circuit 5 and the control circuit 35 with a signal which indicates that the remaining data length of the 3rd cycle is 3 bits.

Subsequently, in the 4th cycle, necessary-length data shown at (e) in FIG. 2 is inputted to the logic circuit 31. The necessary-length data inputted in the 4th cycle and remaining data in the 3rd cycle are concatenated at the data concatenation step. The resulting data is shifted by 3 bits because the remaining data length of the 3rd cycle is 3 owing to the control circuit 35. Thus, the heads of reference data corresponding to the fourth code, et seq. as contained in the table 32 and data delivered from the logic circuit 31 are brought into agreement, thereby to permit a comparison in the comparator 33 at the data comparison step being the next step. Besides, on condition that both the data have matched as the result of the comparison, the code discriminator 34 discriminates the fourth code and delivers this code as output data at the code-data discrimination step.

While the Huffman decoder 3 operates as stated above in the decoding apparatus for variable-length codes according to this embodiment, the other operations are similar to those of the decoding apparatus for variable-length codes according to Embodiment 1, a nd while the decode processing is executed by the steps as stated above in the decoding method, the other processing is similar to that of the decoding method for variable-length codes according to Embodiment 1.

Incidentally, the case where the maximum length which the individual variable-length codes can take is 10 bits (N=10) and where k=6 holds has been described in the above operation of the Huffman decoder 3. However, the values N and k are not restricted to them, but in an actual product, N=26 and k=8 are held, while a necessary length is set at 32 bits. In this case, accordingly, a remaining data length is expressed by 5 bits, a movement magnitude in the logic circuit 1 is set at the number of bits being a multiple of 8 up to 32, and a movement magnitude in the logic circuit 31 is 3~26and is expressed by 5 bits.

As seen from the foregoing, in accordance with the decoding apparatus and decoding method for variable-length codes according to Embodiment 2, a data processing speed in the logic circuit 1 can be heightened similarly to that of the decoding apparatus and decoding method for variable-length codes according to Embodiment 1, and since the data concatenation circuit and the table shift portion are dispensed with, the circuit scale of the Huffman decoder 3 can be reduced to realize still higher processing as compared with that of the decoding apparatus and decoding method for variable-length codes according to Embodiment 1.

Incidentally, it is to be considered that the embodiments disclosed at this time are exemplary in all points, and that they are not restrictive. More specifically, the decode means shall not be restricted to the Huffman decoder, the movement means shall not be restricted to the table shift portion, and the storage means shall not be restricted to the table. In addition, the decode processing shall not be restricted to the Huffman decode processing, the movement of the reference data shall not be restricted to the movement by the table shift, and the storage of the reference data shall not be restricted to the storage in the table.

Industrial Applicability

As described above, in accordance with the decoding apparatus and decoding method for variable-length codes according to the present invention, input data consisting of a plurality of variable-length codes can be decoded more efficiently than in the prior art. Moreover, in accordance with the present invention, it is permitted to shift input data and reference data in parallel, so that the input data can be decoded at a higher speed than in the prior art. Moreover, in accordance with the present invention, input data can be decoded at a higher speed than in the prior art without enlarging the circuit scale of decode means.

In this manner, the invention contributes greatly to heightening the speed of the decoding of the codes without enlarging the circuit scale, and it can be extensively utilized in fields relevant to image processing.

What is claimed is:

1. A decoding apparatus for variable-length codes wherein input data which consist of a plurality of variable-length codes of at most N bits are decoded successively in a plurality of cycles, comprising:

a first logic circuit which receives the input data, and which delivers necessary-length data having the minimum number of bits that is a multiple of k and that exceeds N;

decode means connected to said first logic circuit, for delivering a data length of remaining data obtained by removing the first variable-length code contained in the necessary-length data, from said necessary-length data, and for decoding said necessary-length data in accordance with the remaining data in the preceding cycle and then outputting the decoded data; and     first control means connected to said decode means, for controlling said first logic circuit so as to receive the input data having the number of bits that is the multiple of k depending upon the data length of said remaining data;

wherein symbol N denotes a natural number of at least 2, and symbol k denotes a natural number smaller than the number N.

2. A decoding apparatus for variable-length codes as defined in claim 1, wherein said decode means includes:

storage means for prestoring therein reference data corresponding to the plurality of variable-length codes contained in said input data;

movement means for moving the reference data in accordance with said data length of said remaining data;

comparison means for comparing the received necessary-length data and said reference data moved by said movement means;

code discrimination means for discriminating and outputting the variable-length code contained in said input data, in accordance with a result of the comparison made by said comparison means, and for feeding said first control means with said data length of said remaining data; and second control means for feeding said movement means with said data length of said remaining data as determined in accordance with a result of the discrimination made by said code discrimination means.

3. A decoding apparatus for variable-length codes as defined in claim 1, wherein said decode means includes:

a second logic circuit which concatenates the received necessary-length data with said remaining data in said preceding cycle;

storage means for prestoring therein reference data corresponding to the plurality of variable-length codes contained in said input data;

comparison means for comparing data delivered from said second logic circuit and the reference data;

code discrimination means for discriminating and outputting the variable-length code contained in said input data, in accordance with a result of the comparison made by said comparison means, and for feeding said first control means with said data length of said remaining data; and second control means for feeding said second logic circuit with said remaining data determined in accordance with a result of the discrimination made by said code discrimination means.

4. A decoding method for variable-length codes wherein input data which consist of a plurality of variable-length codes of at most N bits are decoded successively in a plurality of cycles, comprising:

computing from the input data, necessary-length data having the minimum number of bits that is a multiple of k and that exceeds N;

subjecting the necessary-length data to decode processing in accordance with remaining data in the preceding cycle;

computing a data length of the remaining data obtained by removing the first variable-length code contained in said necessary-length data, from said necessary-length data; and controlling said input data so as to have the number of bits that is the multiple of k, in accordance with the data length of said remaining data;

wherein symbol N denotes a natural number of at least 2, and symbol k denotes a natural number smaller than the number N.

5. A decoding method for variable-length codes as defined in claim 4, wherein said decode processing includes:

prestoring reference data corresponding to the plurality of variable-length codes contained in said input data;

moving the reference data in accordance with said data length of said remaining data;

comparing the received necessary-length data and the moved reference data; and discriminating and outputting the variable-length code contained in said input data, in accordance with a result of the comparison, and computing said data length of said remaining data.

6. A decoding method for variable-length codes as defined in claim 4, wherein said decode processing includes:

prestoring reference data corresponding to the plurality of variable-length codes contained in said input data;

concatenating the received necessary-length data with said remaining data in said preceding cycle;

comparing the concatenated data and said reference data; and discriminating and outputting the variable-length code contained in said input data, in accordance with a result of the comparison, and computing said remaining data.

* * * * *

UNITED STATES PATENT AND TRADEMARK OFFICE
CERTIFICATE OF CORRECTION

PATENT NO. : 6,441,757 B1
DATED : April 27, 2002
INVENTOR(S) : Kenji Hirano

It is certified that error appears in the above-identified patent and that said Letters Patent is hereby corrected as shown below:

<u>Title page,</u>
Item [22], after "PCT Filed", please delete "Sep. 2, 1999", and insert
-- Feb. 24, 1999 --.

Signed and Sealed this

Twenty-sixth Day of August, 2003

JAMES E. ROGAN
*Director of the United States Patent and Trademark Office*